(12) United States Patent
Bi (10) Patent No.: US 11,003,527 B2
(45) Date of Patent: May 11, 2021

(54) DECODING METHOD AND DEVICE UTILIZING FLASH CHANNEL CHARACTERISTIC AND DATA STORAGE SYSTEM (71) Applicant: SHANDONG STORAGE WINGS ELECTRONICS TECHNOLOGY CO., LTD., Yantai (CN)

(72) Inventor: Jianzhong Bi, Yantai (CN)

(73) Assignee: Shandong Storage Wings Electronics Technology Co., LTD, Shandong (CN)

( * ) Notice: Subject to any disclaimer, the term of this patent is extended or adjusted under 35 U.S.C. 154(b) by 0 days.

(21) Appl. No.: 15/822,159

(22) Filed: Nov. 26, 2017

(65) Prior Publication Data
US 2019/0095278 A1 Mar. 28, 2019

(30) Foreign Application Priority Data
Sep. 22, 2017 (CN) .......................... 201710868197.4

(51) Int. Cl.
G06F 11/10 (2006.01)
H03M 13/11 (2006.01)
G11C 29/52 (2006.01)

(52) U.S. Cl.
CPC ...... *G06F 11/1048* (2013.01); *G06F 11/1068* (2013.01); *G11C 29/52* (2013.01); *H03M 13/1102* (2013.01)

(58) Field of Classification Search
CPC .. G06F 11/1068; G06F 11/1048; G11C 29/52; G11C 29/42; H03M 13/1102
See application file for complete search history.

(56) References Cited

U.S. PATENT DOCUMENTS 8,301,963 B2 * 10/2012 Hou .................... G06F 11/1068
714/755
9,183,085 B1 * 11/2015 Northcott ............ G06F 11/1068
(Continued)

OTHER PUBLICATIONS

J. Freudenberger, M. Rajab and S. Shavgulidze, "Estimation of channel state information for non-volatile flash memories," 2017 IEEE 7th International Conference on Consumer Electronics—Berlin (ICCE—Berlin), Berlin, 2017, pp. 69-73.*

(Continued)

*Primary Examiner* — Cynthia Britt
(74) *Attorney, Agent, or Firm* — JCIPRNET (57) ABSTRACT

A decoding method and device utilizing a flash channel characteristic and data storage system, wherein the method comprises: acquiring a probability density function curve diagram; determining a to-be-corrected data position according to the current situation of the probability density function curve diagram; transmitting the to-be-corrected data position to a low-density parity check module to perform an operation to correct the to-be-corrected value. The embodiment of the present invention considers the current situation of the probability density curve diagram when determining the to-be-corrected data position, namely, selects different solutions to determine the to-be-corrected data position on the basis of the current situation of the probability density function curve diagram, thus reducing the data transmitted to the low-density parity check module to perform an operation, and reducing operation workload and power consumption.

11 Claims, 12 Drawing Sheets

(56) References Cited

U.S. PATENT DOCUMENTS

| | | | |
|---|---|---|---|
| 9,419,655 B2* | 8/2016 | Cai | G06F 11/1004 |
| 10,153,782 B2* | 12/2018 | Cai | G06F 11/1004 |
| 2011/0225350 A1* | 9/2011 | Burger, Jr. | G11C 7/02 |
| | | | 711/103 |
| 2012/0290899 A1* | 11/2012 | Cideciyan | G06F 11/1072 |
| | | | 714/773 |
| 2013/0290813 A1* | 10/2013 | Ramamoorthy | G06F 11/1068 |
| | | | 714/773 |
| 2015/0006976 A1* | 1/2015 | Jeon | G06F 11/0751 |
| | | | 714/54 |
| 2017/0236592 A1* | 8/2017 | Alhussien | G11C 29/50004 |
| | | | 714/721 |
| 2018/0284735 A1* | 10/2018 | Celia | G05B 19/41875 |

OTHER PUBLICATIONS

Baek S., Choi J., Lee D., Noh S.H. (2007) Performance Characteristics of Flash Memory: Model and Implications. In: Lee YH., Kim HN., Kim J., Park Y., Yang L.T., Kim S.W. (eds) Embedded Software and Systems. ICESS 2007. Lecture Notes in Computer Science, vol. 4523. Springer, Berlin, Heidelberg (Year: 2007).*

H. Hayashi et al., "Optimization of program and erase characteristics of two bit flash memory P-channel cell structure using TCAD," 2014 International Conference on Simulation of Semiconductor Processes and Devices (SISPAD), Yokohama, 2014, pp. 169-172. (Year: 2014).*

D. Gupta and S. K. Vishvakarma, "Improved Short-Channel Characteristics With Long Data Retention Time in Extreme Short-Channel Flash Memory Devices," in IEEE Transactions on Electron Devices, vol. 63, No. 2, pp. 668-674, Feb. 2016. (Year: 2016).*

* cited by examiner

$c_3 \oplus c_6 \oplus c_7 \oplus c_8 = 0$
$c_1 \oplus c_2 \oplus c_5 \oplus c_{12} = 0$
$c_4 \oplus c_9 \oplus c_{10} \oplus c_{11} = 0$
$c_2 \oplus c_6 \oplus c_7 \oplus c_{10} = 0$
$c_1 \oplus c_3 \oplus c_8 \oplus c_{11} = 0$
$c_4 \oplus c_5 \oplus c_9 \oplus c_{12} = 0$
$c_1 \oplus c_4 \oplus c_5 \oplus c_7 = 0$
$c_6 \oplus c_8 \oplus c_{11} \oplus c_{12} = 0$
$c_2 \oplus c_3 \oplus c_9 \oplus c_{10} = 0$ Fig. 9                  Fig. 10

DECODING METHOD AND DEVICE UTILIZING FLASH CHANNEL CHARACTERISTIC AND DATA STORAGE SYSTEM

RELATED APPLICATION

The present application claims priority to the Chinese patent application CN201710868197.4 filed Sep. 22, 2017, which is incorporated herein by reference in its entirety.

FIELD OF THE INVENTION

The present invention relates to the technical field of computers. More particularly, this invention describes a decoding method and device utilizing a flash channel characteristic and data storage system.

BACKGROUND OF THE INVENTION

At present, an error code of a flash chip is corrected by adopting the soft decision of a low-density parity check (LDPC) code. Specifically, the existing error code correction method first calculates the probability value of 0 or 1, then substitutes the probability value into a plurality of equations (such as the MIN SUM equation or the SUM PRODUCT equation) to perform an operation. The method has an extremely great operation workload and large power consumption.

OBJECTS AND SUMMARY OF THE INVENTION

The object of the embodiment of the present invention is to provide a decoding method and device utilizing a flash channel characteristic and data storage system, so as to reduce operation workload and power consumption.

To achieve the above object, in a first aspect, the embodiment of the present invention provides a decoding method utilizing a flash channel characteristic, comprising:

Acquiring a probability density function curve diagram;

Determining a to-be-corrected data position according to the current situation of the probability density function curve diagram; and Transmitting the to-be-corrected data position to a low-density parity check module to perform an operation to correct the to-be-corrected data value.

As an alternative embodiment, after the step of acquiring a probability density function curve diagram, the method further comprises:

Determining the current situation of the probability density function curve diagram according to the program/erase cycle of a flash.

As an alternative embodiment, the probability density function curve diagram comprises a plurality of probability density function curves; a first situation of the probability density function curve diagram comprises the situation that any two adjacent probability density function curves do not intersect; and determining a to-be-corrected data value according to the current situation of the probability density function curve diagram, specifically comprises:

Adopting a preset first voltage to read the current data value of the flash, and determining the current data value to be the to-be-corrected data position.

As an alternative embodiment, the probability density function curve diagram comprises a plurality of probability density function curves; a second situation of the probability density function curve diagram comprises the situation that any two adjacent probability density function curves intersect; and determining a to-be-corrected data value according to the current situation of the probability density function curve diagram, specifically comprises:

Adopting a preset first voltage and a second voltage to read the flash to find an undetermined data position, and read the current data value of the undetermined data position;

Finding a target equation according to the undetermined position, wherein the target equation is associated with the undetermined position, and is stored in the low-density parity check module; and Correcting the current data value according to the target equation, and determining the corrected current data value to be the to-be-corrected data value.

As an alternative embodiment, after the step of transmitting the to-be-corrected data position to a low-density parity check module to perform an operation to correct the to-be-corrected data value, the method further comprises:

After the position of the to-be-corrected data is confirmed and corrected by the low-density parity check module, recording and storing the position of the to-be-corrected data on each page and the equation corresponding to the position; and When the first voltage and the second voltage are adopted to read the page, operating the to-be-corrected data according to the equation in a table to acquire the initial write value of the to-be-corrected data.

In a second aspect, the embodiment of the present invention further provides a decoding device utilizing a flash channel characteristic, comprising:

An acquisition module, for acquiring a probability density function curve diagram;

A first determination module, for determining a to-be-corrected data position according to the current situation of the probability density function curve diagram; and A correction module, for transmitting the to-be-corrected data position to a low-density parity check module to perform an operation to correct the to-be-corrected data value.

As an alternative embodiment, the device further comprises:

A second determination module, for determining the current situation of the probability density function curve diagram according to the program/erase cycle of a flash.

As an alternative embodiment, the probability density function curve diagram comprises a plurality of probability density function curves; a first situation of the probability density function curve diagram comprises the situation that any two adjacent probability density function curves do not intersect; and the first determination module is specifically used for:

Adopting a preset first voltage to read the current data value of the flash, and determining the current data value to be the to-be-corrected data value.

As an alternative embodiment, the probability density function curve diagram comprises a plurality of probability density function curves; a second situation of the probability density function curve diagram comprises the situation that any two adjacent probability density function curves do not intersect; and the first determination module is specifically used for:

Adopting a preset first voltage and a second voltage to read the flash to find an undetermined data position, and read the current data value of the undetermined data position;

Finding a target equation according to the undetermined data position, wherein the target equation is associated with the undetermined position, and is stored in the low-density parity check module; and Correcting the current data value according to the target equation, and determining the corrected current data value to be the to-be-corrected data value.

In a third aspect, the embodiment of the present invention further provides a data storage system, comprising a data interaction flash, a low-density parity check module and a decoding device, wherein the decoding device is described as above.

The decoding method and device utilizing a flash channel characteristic and data storage system provided by the embodiment of the present invention consider the current situation of the probability density curve diagram when determining the to-be-corrected data position. Namely, the present invention selects different solutions to determine the to-be-corrected data position on the basis of the current situation of the probability density function curve diagram, thus reducing the data transmitted to the low-density parity check module to perform an operation, and reducing operation workload and power consumption.

BRIEF DESCRIPTION OF FIGURES

In order to clearly illustrate the embodiments of the present invention or the technical solution in the prior art, the drawings required for the description of the embodiments or the prior art will be briefly introduced hereafter. In all the drawings, the similar elements or parts are generally denoted with similar drawing marks. In the drawings, the elements and parts are not necessarily drawn in an actual proportion.

DETAILED DESCRIPTION OF THE EMBODIMENTS

The embodiments of technical solution of the present invention will be described in detail in connection with the attached drawings. The following embodiments only serve as examples to illustrate the technical solution of the invention and not be given to limit the scope of protection of the invention.

It shall be noted that unless otherwise mentioned, all technical and scientific terms used herein have the same meaning as commonly understood by a person skilled in the art to which the invention belong.

Figure 1:
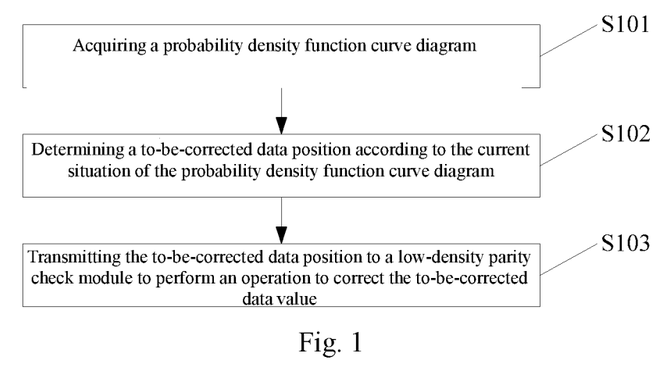
FIG. 1 is a flow chart of the decoding method utilizing a flash channel characteristic according to the first embodiment of the present invention.

Please refer to FIG. 1 which is a flow chart of the decoding method utilizing a flash channel characteristic according to the first embodiment of the present invention. As shown in the figure, the method can comprise the following steps:

S101, acquiring a probability density function curve diagram.

S102, determining a to-be-corrected data position according to the current situation of the probability density function curve diagram.

S103, transmitting the to-be-corrected data position to a low-density parity check module to perform an operation to correct the to-be-corrected data value.

The decoding method utilizing a flash channel characteristic provided by the embodiment of the present invention considers the current situation of the probability density curve diagram when determining the to-be-corrected data position. Namely, the present invention selects different solutions to determine the to-be-corrected data position on the basis of the current situation of the probability density function curve diagram, thus reducing the data transmitted to the low-density parity check module to perform an operation, and reducing operation workload and power consumption.

Figure 2:
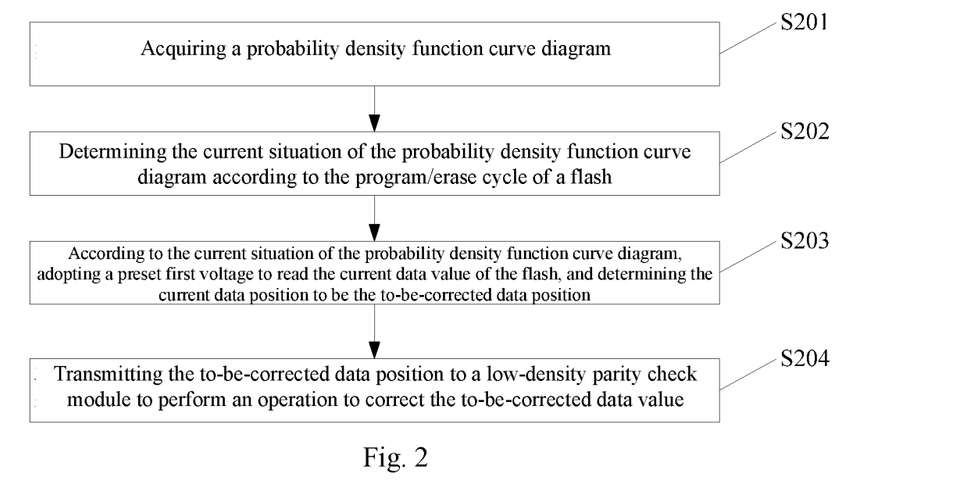
FIG. 2 is a flow chart of the decoding method utilizing a flash channel characteristic according to the second embodiment of the present invention.

Please refer to FIG. 2 which is a flow chart of the decoding method utilizing a flash channel characteristic according to the second embodiment of the present invention. As shown in the figure, the method can comprise the following steps:

S201, acquiring a probability density function curve diagram.

Figure 3:
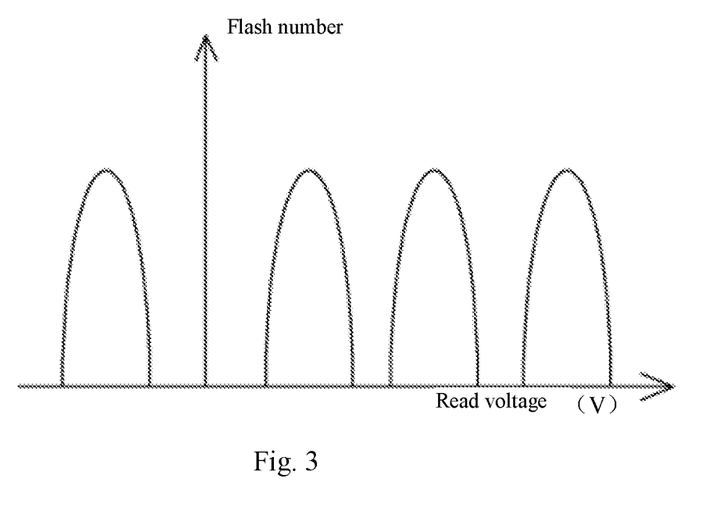
FIG. 3 is a first probability density function curve diagram.

Specifically, acquiring the probability density function (PDF) curve diagram from a flash chip manufacturer, as shown in FIG. 3. In the figure, the abscissa denotes the read voltage, and the ordinate denotes the number of flash cells. Furthermore, the figure comprises a plurality of probability density function (PDF) curves.

S202, determining the current situation of the probability density function curve diagram according to the program/erase cycle of a flash.

The flash chip comprises multiple different types of flash cells, such as a multi-level cell (MLC), a single-level cell (SLC) and a triple-level cell (TLC). Taking the MLC as an example, the PDF curves in FIG. 3 can drift with the program/erase cycle (PE cycle), enabling the PDF curves to intersect with each other. Therefore, the current situation of the probability density function curve diagram can be determined according to the program/erase cycle of a flash. Any two adjacent PDF curves do not intersect before the program/erase cycles of the flash reach a certain number. In the present embodiment, the program/erase cycles of the flash do not reach a certain number. Therefore, the current situation of the probability density function curve diagram can be determined any two adjacent PDF curves do not intersect, as shown in FIG. 3.

S203, according to the current situation of the probability density function curve diagram, adopting a preset first voltage to read the current data value of the flash, and determining the current data value to be the to-be-corrected data value.

Figure 4A:
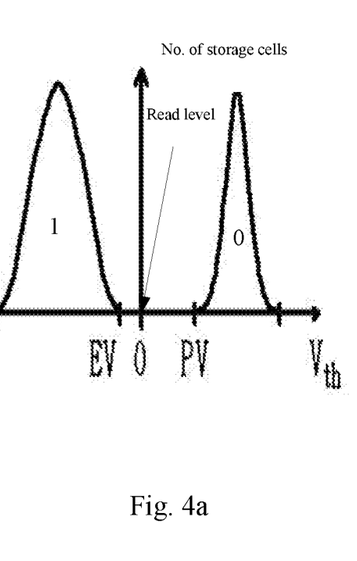
FIG. 4a is a threshold voltage distribution diagram of the SLC.
Figure 4B:
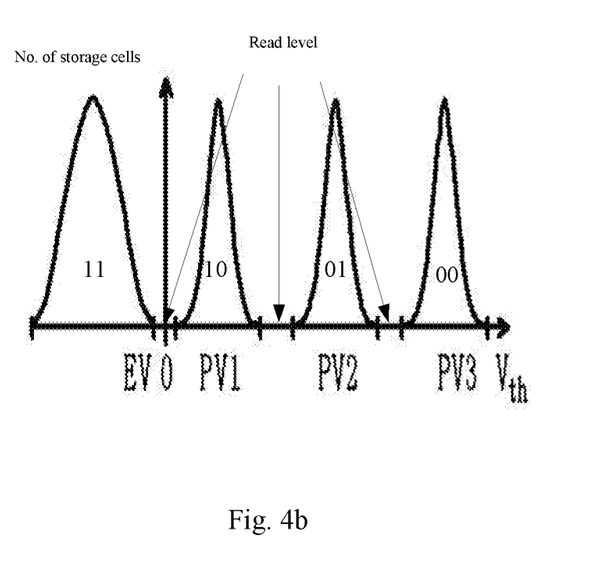
FIG. 4b is a threshold voltage distribution diagram of the MLC.

When the current situation of the probability density function curve diagram is that any two PDF curves do not intersect, the preset first voltage (namely one voltage) can be adopted to read the current data value of the flash, and the current data value is determined to be the to-be-corrected data value.

Wherein the number of the first voltages is selected with relation to the number n of storage cells, and is generally n−1. For example, as shown in FIG. 4a, the SLC has one read voltage (namely the first voltage); as shown 4b, the MLC has three read voltages, and the TLC has seven read voltages.

Further, the value of the first voltage is determined according to the probability density function curve diagram.

S204, transmitting the to-be-corrected data position to a low-density parity check module to perform an operation to correct the to-be-corrected data value.

Specifically, transmitting the to-be-corrected data position to a low-density parity check (LDPC) module to perform an iteration operation to correct the to-be-corrected data value.

It should be noted that the solution described by the embodiment is: before the program/erase cycles reach a certain number, the PDF curves do not intersect, and hard decision is adopted to perform decoding (equivalent to adopting one voltage to read the data value of the flash). The full utilization of hard decision during decoding can achieve the advantage of minimum operation workload.

The decoding method utilizing a flash channel characteristic provided by the embodiment of the present invention considers the current situation of the probability density curve diagram when determining the to-be-corrected data position. Namely, the present invention selects different solutions to determine the to-be-corrected data position on the basis of the current situation of the probability density function curve diagram, thus reducing the data transmitted to the low-density parity check module to perform an operation, and reducing operation workload and power consumption.

Figure 5:
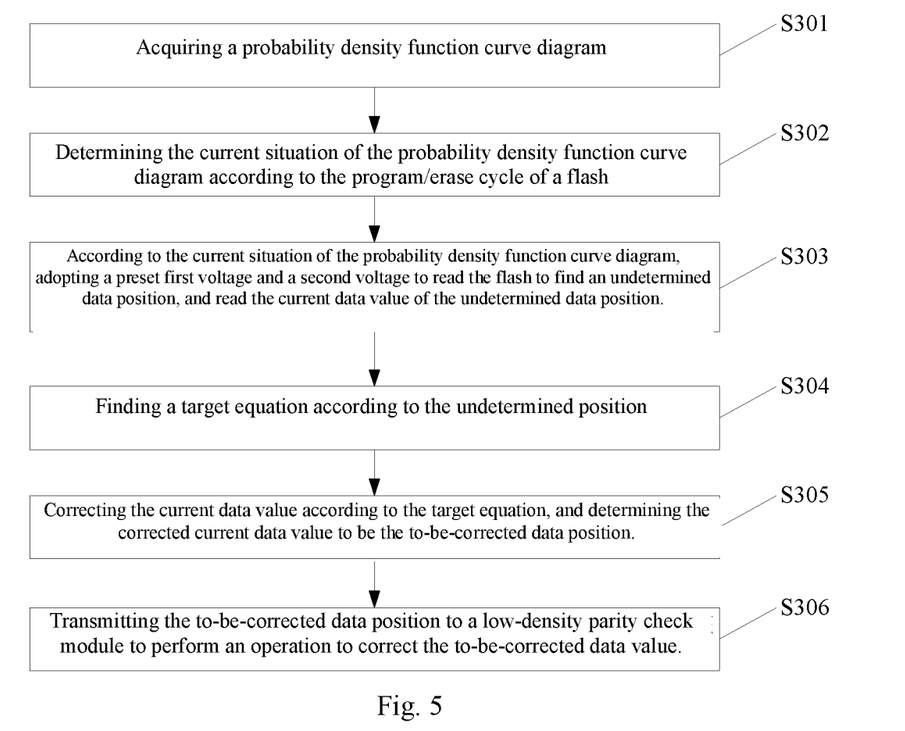
FIG. 5 is a flow chart of the decoding method utilizing a flash channel characteristic according to the third embodiment of the present invention.

Please refer to FIG. 5 which is a flow chart of the decoding method utilizing a flash channel characteristic according to the third embodiment of the present invention. As shown in the figure, the method can comprise the following steps:

S301, constructing a probability density function curve diagram according to a flash channel characteristic.

Figure 6:
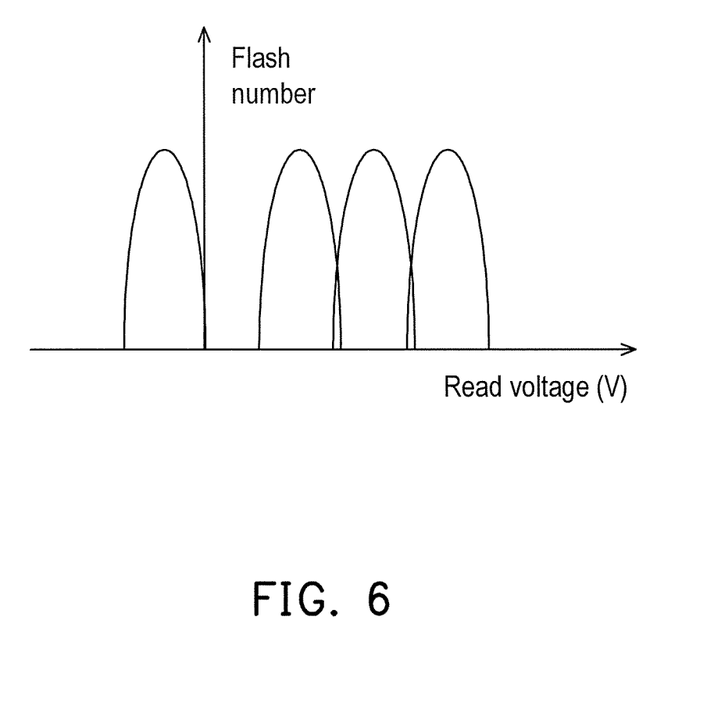
FIG. 6 is a second probability density function curve diagram.

Specifically, acquiring the probability density function curve diagram from a flash chip manufacturer, as shown in FIG. 6. In the figure, the abscissa denotes the read voltage, and the ordinate denotes the number of flash cells. Furthermore, the figure comprises a plurality of probability density function (PDF) curves.

S302, determining the current situation of the probability density function curve diagram according to the program/erase cycle of a flash.

In connection with the description of step S202, when the program/erase cycles of the flash reach a certain number, any two adjacent PDF curves will intersect. In the present embodiment, the program/erase cycles of the flash already reach a certain number. Therefore, the current situation of the probability density function curve diagram can be determined any two adjacent PDF curves intersect, as shown in FIG. 6.

S303, according to the current situation of the probability density function curve diagram, adopting a preset first voltage and a second voltage to read the flash to find an undetermined data position, and read the current data value of the undetermined data position.

Figure 7:
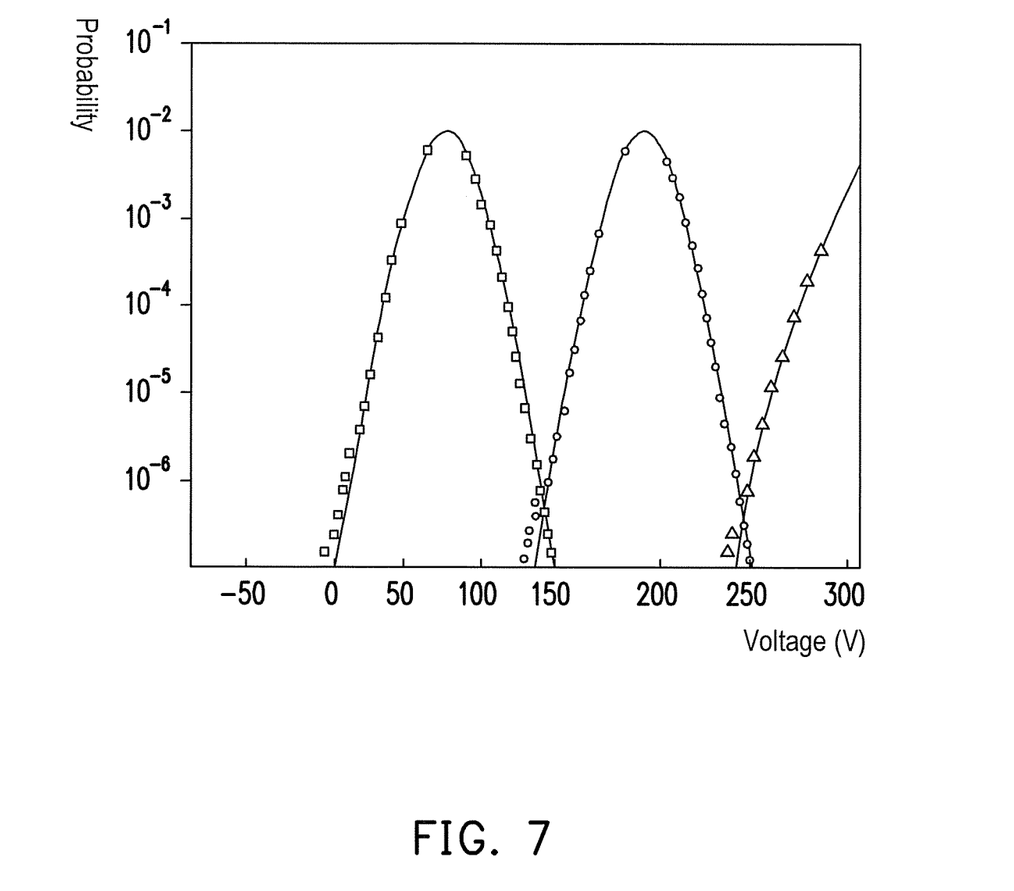
FIG. 7 is another schematic view of the probability density function curves.
Figure 8:
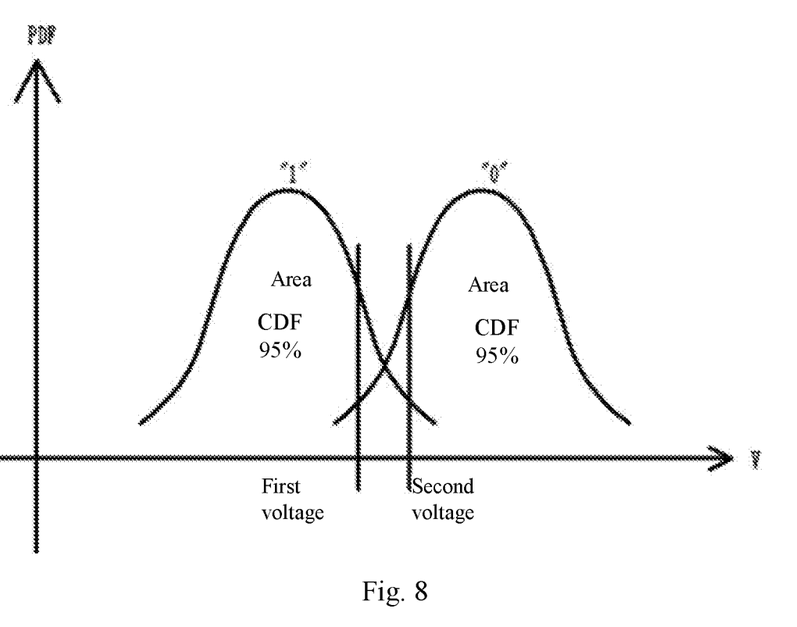
FIG. 8 is a schematic view of a principle for selecting the first voltage and the second voltage.

With reference to FIG. 7 and FIG. 8, the first voltage and the second voltage shall be selected with reference to the probability density function curve diagram related to the program/erase cycle (PE cycle). Furthermore, when selecting a voltage value, the 95% voltage values distributed on the two sides are taken as read reference voltage values, wherein 95% is an example, and the specific percentage shall be determined according the error correction capability of the LDPC and the number of bits. It should be noted that in FIG. 8, CDF refers to a cumulative density function.

Further, when the current situation of the probability density function curve diagram is any two PDF curves intersect, the first voltage and the second voltage which are different are adopted to read twice to find all the undetermined data positions in the flash, and acquire the current data values of the undetermined data positions.

Figure 9:
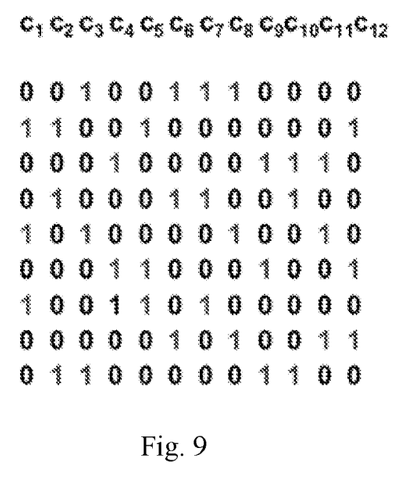
FIG. 9 is diagram of a 12 bit LDPC matrix.
Figure 10:
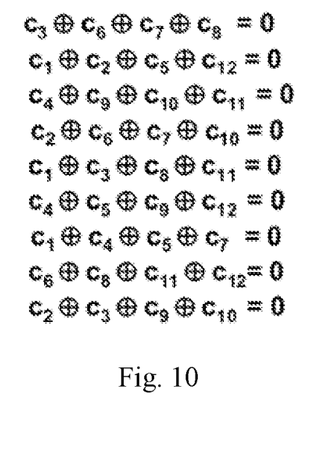
FIG. 10 is a schematic view of equations.

S304, finding a target equation according to the undetermined data position.

Wherein the target equation is associated with the undetermined data position, and is stored in the low-density parity check module; and With reference to FIG. 9 and FIG. 10, if the two read values at the position c3 are found different, then the position c3 is determined to be the undetermined data position. Further, the equations related to c3 are found out as follows:

$$c3 \oplus c6 \oplus c7 \oplus c8 = 0$$

$$c1 \oplus c3 \oplus c8 \oplus c11 = 0$$

$$c2 \oplus c3 \oplus c9 \oplus c10 = 0$$

In this case, the value of c3 must satisfy the above three equations.

S305, correcting the current data value according to the target equation, and determining the corrected current data value to be the to-be-corrected data value.

S306, transmitting the to-be-corrected data position to a low-density parity check module to perform an operation to correct the to-be-corrected data value.

Specifically, transmitting the to-be-corrected data position to the low-density parity check module to perform an iteration operation to correct the to-be-corrected data value.

In the embodiment, after the step S306, the method can further comprise the following steps: after the position of the erroneous (to-be-corrected) data is finally confirmed and corrected by the low-density parity check (LDPC) module, recording and storing in a table the position of the erroneous (to-be-corrected) data on each page and the equation corresponding to the position; and when a voltage is adopted to read the page next time, operating the erroneous data according to the equation recorded in the table to acquire the initial write value of the erroneous data. The principle of the above process is: in a flash cell, the process of becoming bad is irreversible and is necessarily not stochastic; the erroneous positions are recorded from the beginning until the bad data exceeds the total number the LDPC can correct, then the page is announced to be bad and is not allowed to be used again.

The decoding method utilizing a flash channel characteristic provided by the embodiment of the present invention has the following advantages: (1) when the program/erase cycles reach a certain number, the undetermined position and the data value thereof are found out via a re-reading mechanism, the data value is then transmitted to the low-density parity check module to perform an iteration operation, instead of blindly transmitting all the data values of a flash the low-density parity check module to perform an iteration operation, thus reducing operation workload and power consumption; and (2) independent of probability: different from the dominant soft decision at present, the embodiment does not have probability operation, and is not purely a hard decision.

It should be noted that in the decoding method provided by the second embodiment, the PDF curves do not intersect and no undetermined data exists, in which case the low-density parity check (LDPC) module corrects the bit flip error of the data; and in the decoding method provided by the third embodiment, the PDF curves intersect and undetermined data exists, in which case a part of equations (namely the target equations) are found out first, then the undetermined data is corrected according to the found equations, and finally the corrected undetermined data is transmitted to the low-density parity check (LDPC) module to correct the bit flip error of the data.

Figure 11:
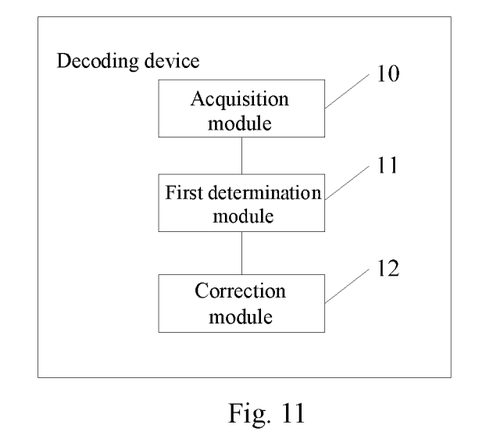
FIG. 11 is a structural schematic view of the decoding device utilizing a flash channel characteristic according to the first embodiment of the present invention.

Please refer to FIG. 11 which is a structural schematic view of the decoding device utilizing a flash channel characteristic according to the first embodiment of the present invention. As shown in the figure, the decoding device can comprise:

An acquisition module 10, for acquiring a probability density function curve diagram;

A first determination module 11, for determining a to-be-corrected data position according to the current situation of the probability density function curve diagram; and A correction module 12, for transmitting the to-be-corrected data position to a low-density parity check module to perform an operation to correct the to-be-corrected data value.

The decoding device utilizing a flash channel characteristic provided by the embodiment of the present invention considers the current situation of the probability density curve diagram when determining the to-be-corrected data position. Namely, the present invention selects different solutions to determine the to-be-corrected data position on the basis of the current situation of the probability density function curve diagram, thus reducing the data transmitted to the low-density parity check module to perform an operation, and reducing operation workload and power consumption.

Figure 12:
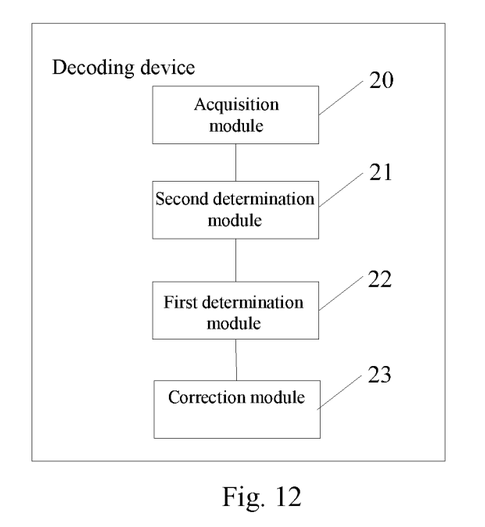
FIG. 12 is a structural schematic view of the decoding device utilizing a flash channel characteristic according to the second embodiment of the present invention.

Please refer to FIG. 12 which is a structural schematic view of the decoding device utilizing a flash channel characteristic according to the second embodiment of the present invention. As shown in the figure, the decoding device can comprise:

An acquisition module 20, for acquiring a probability density function curve diagram;

A second determination module 21, for determining the current situation of the probability density function curve diagram according to the program/erase cycle of a flash;

A first determination module 22, for determining a to-be-corrected data position according to the current situation of the probability density function curve diagram; and A correction module 23, for transmitting the to-be-corrected data position to a low-density parity check module to perform an operation to correct the to-be-corrected data value.

Wherein the probability density function curve diagram comprises a plurality of probability density function curves; the current situation of the probability density function curve diagram comprises the situations that any two adjacent probability density function curves do not intersect and intersect. When any two adjacent probability density function curves do not intersect, the first determination module 22 is specifically used for:

Adopting a preset first voltage to read the current data value of the flash, and determining the current data value to be the to-be-corrected data position.

When any two adjacent probability density function curves intersect, the first determination module 22 is specifically used for:

Adopting a preset first voltage and a second voltage to read the flash to find an undetermined data position, and read the current data value of the undetermined data position;

Finding a target equation according to the undetermined position, wherein the target equation is associated with the undetermined data position, and is stored in the low-density parity check module; and Correcting the current data value according to the target equation, and determining the corrected current data value to be the to-be-corrected data position.

The decoding device utilizing a flash channel characteristic provided by the embodiment of the present invention considers the current situation of the probability density curve diagram when determining the to-be-corrected data position. Namely, the present invention selects different solutions to determine the to-be-corrected data position on the basis of the current situation of the probability density function curve diagram, thus reducing the data transmitted to the low-density parity check module to perform an operation, and reducing operation workload and power consumption.

It should be noted that the specific operating principle of the decoding device utilizing a flash channel characteristic provided by the embodiment of the present invention can refer to the above method flow part, and will not be repeated here.

Figure 13:
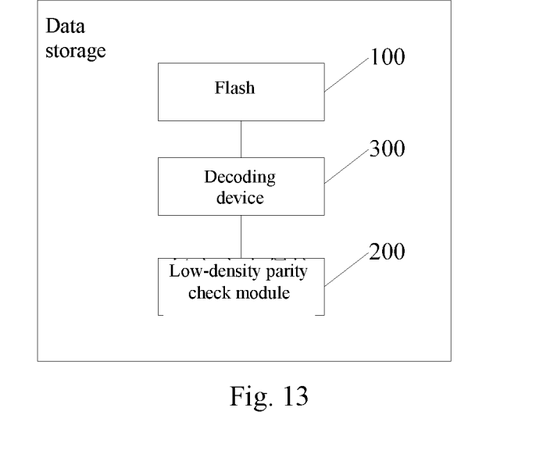
FIG. 13 is a structural schematic view of a data storage system according to the first embodiment of the present invention.

Still with reference to FIG. 13 which is a structural schematic view of a data storage system according to the first embodiment of the present invention. As shown in the figure, the system can comprise a data interaction flash 100, a low-density parity check module 200 and a decoding device 300. Wherein the specific structure and operating flow of the decoding device can refer to the description of the above decoding device and decoding method parts, and will not be repeated here.

The above various embodiments are only used to illustrate the technical solution of the present invention without limitation; and despite reference to the aforementioned embodiments to make a detailed description for the present invention, an ordinary person skilled in the art should understand: the described technical solution in above various embodiments can be modified or the part of or all technical features can be equivalently substituted; and the modifications or substitutions do not make the essence of the corresponding technical solutions deviate from the scope of the technical solutions of the embodiments of the present invention, all of which should be contained within the scope of the claims and description of the present invention.

What is claimed is:

1. A decoding method utilizing a flash channel characteristic, comprising:
   acquiring a probability density function curve diagram according to a flash;
   determining a situation of the probability density function curve diagram according to a program/erase cycle of the flash after acquiring the probability density function curve diagram;
   determining a value of a data to be corrected according to a situation of the probability density function curve diagram; and
   transmitting the value of the data to be corrected to a flash memory controller to perform an operation to correct the value of the data to be corrected.

2. The method in claim 1, wherein
   the probability density function curve diagram comprises a plurality of probability density function curves;
   the probability density function curve diagram comprises a first situation that any two adjacent probability density function curves do not intersect; and
   determining the value of the data to be corrected comprises:
   using a preset first voltage to read the a current data value of the flash, and determining the current data value to be the value of the data to be corrected.

3. The method in claim 2, after transmitting the value of the data to be corrected to the flash memory controller to perform an operation to correct the value of the data to be corrected, further comprising:
   after the current data value of the unverified data position is corrected flash memory controller, recording and storing the current data value of the unverified data position on each page and the target equation corresponding to the unverified position in a table; and
   when the first voltage and the second voltage are used to read the page, operating the value of the data to be corrected according to the target equation in the table to acquire the an initial write value of the data to be corrected.

4. The method as claimed in claim 1, wherein:
   the probability density function curve diagram comprises a plurality of probability density function curves;
   the probability density function curve diagram comprises a second situation that any two adjacent probability density function curves intersect; and
   determining the value of the data to be corrected comprises:
   using a preset first voltage and a second voltage to read the flash to find an unverified data position and a current data value of the unverified data position;
   finding a target equation according to the unverified data position, wherein the target equation is associated with the unverified data position, and is stored in the flash memory controller; and
   correcting the current data value according to the target equation, and determining the a corrected current data value to be the value of the data to be corrected.

5. A decoding device implementing the decoding method of claim 1.

6. A decoding device utilizing a flash channel characteristic, configured to:
   acquire a probability density function curve diagram according to a flash;
   determine a situation of the probability density function curve diagram according to a program/erase cycle of the flash;
   determine a value of a data to be corrected according to a situation of the probability density function curve diagram; and
   transmit the data position of the data to be corrected to the flash memory controller to perform an operation to correct the data value of the data to be corrected.

7. The device in claim 6, further configured to use a preset first voltage to read a current data value of the flash, and to determine the current data value to be the value of the data to be corrected, wherein:
   the probability density function curve diagram comprises a plurality of probability density function curves;
   the probability density function curve diagram comprises a first situation that any two adjacent probability density function curves do not intersect.

8. The device in claim 6, further configured to:
   use a preset first voltage and a second voltage to read the flash to find an unverified data position and a current data value of the unverified data position;
   find a target equation according to the unverified data position, wherein the target equation is associated with the unverified data position, and is stored in the flash memory controller; and
   correct the current data value according to the target equation, and determine a corrected current data value to be the value of the data to be corrected, wherein:
   the probability density function curve diagram comprises a plurality of probability density function curves;
   the probability density function curve diagram comprises a second situation that any two adjacent probability density function curves intersect.

9. A data storage system, comprising a flash; a flash memory controller; and a decoding device utilizing a flash channel characteristic, wherein the decoding device is configured to:
   acquire a probability density function curve diagram according to the flash;
   determine a situation of the probability density function curve diagram according to a program/erase cycle of the flash;
   determine a value of a data to be corrected according to the situation of the probability density function curve diagram; and
   transmit the value of the data to be corrected to a flash memory controller to perform an operation to correct the value of the data to be corrected.

10. The data storage system in claim 9, wherein:
    the probability density function curve diagram comprises a plurality of probability density function curves;
    the probability density function curve diagram comprises a first situation that any two adjacent probability density function curves do not intersect; and
    the decoding device is further configured to use a preset first voltage to read a current data value of the flash, and determining the current data value to be the value of the data to be corrected.

11. The data storage system in claim 9, wherein:
    the probability density function curve diagram comprises a plurality of probability density function curves;
    the probability density function curve diagram comprises a second situation that any two adjacent probability density function curves intersect; and
    the decoding device is further configured:
    use a preset first voltage and a second voltage to read the flash to find an unverified data position and a current data value of the unverified data position;

find a target equation according to the unverified data position, wherein the target equation is associated with the unverified data position, and is stored in the flash memory controller; and correct the current data value according to the target equation, and determine a corrected current data value to be the value of the data to be corrected.

\* \* \* \* \*